United States Patent [19]

Meyer

[11] 4,153,908

[45] May 8, 1979

[54] PHOTOSENSITIVE MATRIX WITH SUBSTRATE

[75] Inventor: Juergen Meyer, Taunusstein, Fed. Rep. of Germany

[73] Assignee: Heimann GmbH, Fed. Rep. of Germany

[21] Appl. No.: 738,898

[22] Filed: Nov. 4, 1976

[30] Foreign Application Priority Data

Nov. 19, 1975 [DE] Fed. Rep. of Germany ....... 2551956

[51] Int. Cl.² .............................................. H01L 27/14
[52] U.S. Cl. ................................... 357/32; 250/211 J; 357/80
[58] Field of Search ............................ 357/32, 30, 80; 340/173 SP; 313/500; 365/103; 250/211 J

[56] References Cited

U.S. PATENT DOCUMENTS

| | | | |
|---|---|---|---|
| 3,401,266 | 9/1968 | Cooke-Yarborough | 357/19 X |
| 3,840,769 | 10/1974 | Yamamoto et al. | 313/500 |
| 3,908,184 | 9/1975 | Anazawa et al. | 357/80 |
| 4,020,474 | 4/1977 | Meyer et al. | 340/173 SP |

Primary Examiner—Stanley D. Miller, Jr.
Assistant Examiner—James W. Davie
Attorney, Agent, or Firm—Hill, Gross, Simpson, Van Santen, Steadman, Chiara & Simpson

[57] ABSTRACT

A photosensitive matrix having a substrate with a group of row conductors, a group of column conductors extending across the row conductors to form a plurality of points of intersection with a photoconductive cell in series with a rectifier adjacent each point to inteconnect the row conductor to the column conductor characterized by the substrate being of a material which is at least approximately light impermeable in the light-sensitive spectrum of the photoconductive cells so that light projected on one cell is not conducted by the substrate to create a false signal in adjacent cells. Preferably, the substrate is a ceramic material which has been dyed black and the dyed black ceramic material consists of $Al_2O_3$ mixed with $Fe_2O_3$.

3 Claims, 1 Drawing Figure

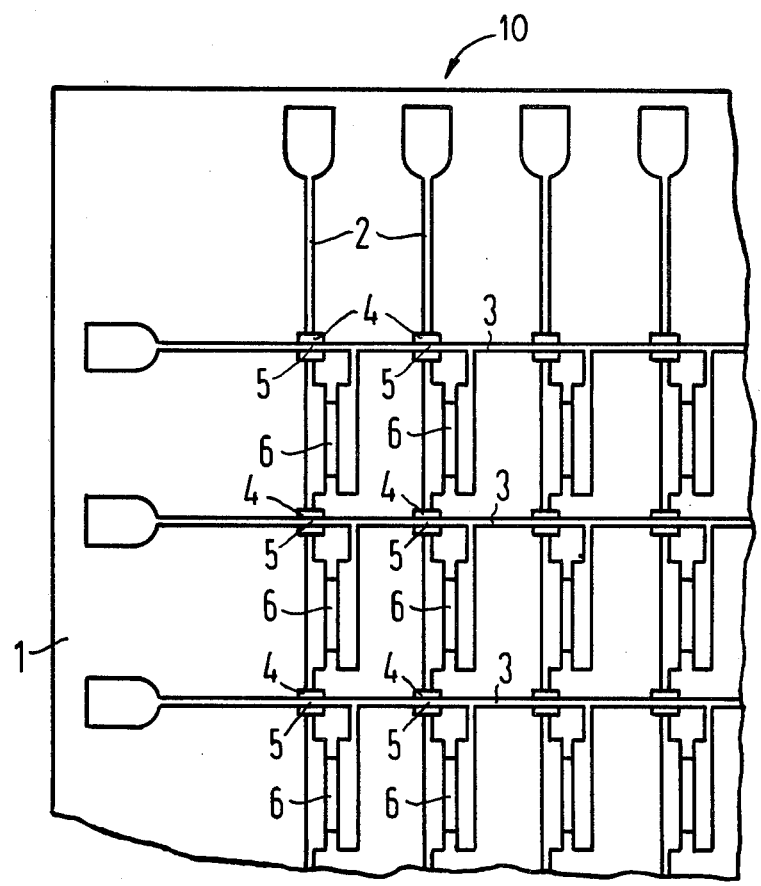

PHOTOSENSITIVE MATRIX WITH SUBSTRATE

BACKGROUND OF THE INVENTION

1. Field of the Invention

The present invention is directed to a photosensitive matrix device having a substrate upon which strip-like row conductors and strip-like column conductors are arranged to form a plurality of points of intersection with a photoconductive cell arranged in series with a rectifier at each point of intersection for connecting the row conductor to the column conductor.

2. Prior Art

A photoconductive cell matrix assembly, which has a substrate provided with a plurality of row conductors and a plurality of column conductors intersecting the row conductors at points of intersection, and the intersecting conductors are separated by insulation at the point of intersection and interconnected by a photoconductive cell arranged adjacent each point of intersection, is disclosed in U.S. Pat. No. 3,900,883, which corresponds to German Offenlegungsschrift 2,349,233. This photoconductive matrix is preferably used as a punch card reader, wherein light striking a photoconductive cell causes the cell to allow a flow of current from one conductor to the other conductor to produce a signal.

Other types of photoconductive cell matrices for use in a card reader are disclosed in copending United States patent application Ser. No. 580,919, filed May 27, 1975, which issued as U.S. Pat. No. 4,020,474 and corresponds to German Offenlegungsschrift 24 25 467. In this application, each photoconductive cell is arranged in series with a rectifier so that current flow is limited to one direction.

Known punch card readers often create false signals. The false signals may be due to the fact that when light is projected through a hole in the punch card onto a particular matrix dot or cell, adjacent dots or cells which are positioned under points of the punch card which do not contain holes still receive sufficient light to allow current flow between the conductors and create a false signal. In the past to prevent these interferring signals or cross talk between adjacent cells, it has been suggested to use a number of partially expensive and time-consuming measures to optically insulate each cell from adjacent cells. For instance, one suggested method of eliminating the false signals is to form light channels directly ahead of each of the individual matrix elements and to simultaneously illuminate the card with a bundle of light beams which extend as parallel as possible so that light passing through an opening in the card does not diverge out of the area of the cell for the particular opening. However, the optical insulation of the individual cells of light-sensitive matrix of cells was still not perfect in many instances.

SUMMARY OF THE INVENTION

The present invention is directed to an improvement of a photosensitive matrix on a substrate which improvement eliminates the above-mentioned drawback by preventing optical cross talk between adjacent cells of the matrix and prevents or greatly minimizes the occurrence of false signals.

To accomplish this task, a photosensitive matrix, which has a substrate provided with a first group of strip-shaped conductors and a second group of strip-shaped conductors with the first group being column conductors and the second group being row conductors extending across the column conductors to form a plurality of spaced points of intersection, and the matrix has a photoconductive cell in series with a rectifier adjacent each point of intersection to interconnect the row conductor to the column conductor, has the improvement comprising the substrate consisting of means for preventing optical cross talk between adjacent cells, said means being a material which is at least light impermeable in the light-sensitive spectrum of the photoconductive cells.

The present invention proceeds from the following observations. It was shown that the displace radiation, which causes false signals, was not only caused by dispersed light in the space adjacent the photoconductive cells but that a non-negligible portion of the light, which causes the false signal, is also caused by a conduction of light by the substrate of the matrix. Formerly used substrate materials, for example $Al_2O_3$ ceramics for thick layer circuits, which ceramics have an $Al_2O_3$ content larger than 93%, ceramics of the type Ker 221 as well as specific alkali-free evaporation glasses are all good light conductors. For example, a substrate, which is normally used for photoconductive cells, is a white $Al_2O_3$ ceramic of 1 mm thickness and has a light transmission of approximately 50%.

In a photosensitive matrix with the improvements in accordance with the present invention, the substrate does not contribute to the interferring cross talk so that in connection with suitable measures for guiding light in the space before the matrix, an excellent optical separation or insulation of the individual light sensors or photoconductive cells can be obtained. In the individual case, usable values can even be obtained if less expensive light guiding measures are used and for instance, a certain amount of divergence can be allowed for a light beam being projected at the matrix.

Black colored or black dyed ceramics are particularly suitable as a substrate material which is impermeable to light in the light-sensitive spectrum of the cell and blocks conduction of this light. $Al_2O_3$ which has mixed therein $Fe_2O_3$ prior to sintering as a ceramic substrate, has proven particularly advantageous and it is opaque in the spectrum or range of approximately 0.25 $\mu$m through 1 $\mu$m, which is the light-sensitive spectrum of common photoconductive cells such as CeSe, CdS and ZnS. Furthermore, a ceramic material formed of $Al_2O_3$ mixed with $Fe_2O_3$ is particularly suited as a carrier substance for photoconductors which are produced in accordance with a thermal diffusion method. In particular, no impurities will diffuse from the aluminum-oxide ceramic into the photosensitive layers which impurities might destroy the photoconductivity of the layer.

BRIEF DESCRIPTION OF THE FIGURE

The FIGURE is a partial plan view of a photosensitive matrix in accordance with the present invention.

DESCRIPTION OF THE PREFERRED EMBODIMENT

The principles of the present invention are particularly useful in a photosensitive matrix generally indicated at 10 which is used with a punch card reader device.

The photosensitive matrix 10 comprises a substrate 1 having a surface on which a first group of conductor paths 2 and a second group of conductor paths 3 have been applied. As illustrated, the first group of conductor paths 2 are column conductors and the second group of conductor paths 3 are row conductors. Each row conductor 3 intersects each column conductor 2 at a point of intersection 5 which is provided with an insulating layer 4 to prevent electrical connection therebetween. Each column conductor 2 is interconnected to each cross row conductor 3 adjacent the respective point of intersection by a diode connected in series with a photoconductive cell 6. In the illustrated embodiment, the diode is positioned between the photoconductive cells 6 and the row conductor 3.

The photosensitive matrix 10 is formed of the following materials. The conducting paths 2 and 3 are made of Au, the photoconductive cells 6 of CdS, the diodes of Se, the insulating layer 4 is a high thixotropic two-component epoxy-resin without a filler, and the substrate 1 is made of $Al_2O_3$ ceramic which has been dyed black by the mixing of 0.5-2.0% $Fe_2O_3$ into the $Al_2O_3$ prior to sintering the mixture as a substrate.

The substrate 1 may serve as a carrier for photoconductive cells which are produced in accordance with a thermal diffusion method. The ceramic remains stable in particular at a temperature up to 700° C. and does not release any damaging foreign materials, for example does not release any alkali metals, into photosensitive vapor deposited layers. In addition, the ceramic substrate is inert with respect to those substances which serve as carriers for the doping materials during the thermal diffusion method (CdS, CdSe, $CuCl_2$, $CdCl_2$, $InCl_2$).

The optical quality of the ceramic substrate may be tested in a simple manner. The photoconductive cells are produced on the substrate, then the cells are subjected to the following conditions: 100° C., 1000V/cm and 0 Lux. In the case of insufficient or irregular dying, the dark current increases with an exponential function until the resistance of the cell is completely destroyed.

While the embodiment of the invention has the column and row conductors along with the photoconductive cells disposed on a single surface of the substrate 1, the invention can be used with other structures of a photosensitive matrix such as those structures disclosed in the copending U.S. patent application Ser. No. 580,919. In addition, the particular steps of forming the photoconductive cells along with applying the various column and row conductors can be accomplished by the method disclosed in this patent application whose disclosure is incorporated by reference.

Although various minor modifications may be suggested by those versed in the art, it should be understood that I wish to employ within the scope of the patent warranted hereon, all such modifications as reasonably and properly come within the scope of my contribution to the art.

I claim:

1. In a photosensitive matrix for a punch card reader device, said matrix having a substrate provided with a first group of strip-shaped conductors and a second group of strip-shaped conductors with the first group being column conductors and the second group being row conductors extending across the column conductors to form a plurality of spaced points of intersection, said matrix having a photoconductive cell in series with a rectifier adjacent each point of intersection to interconnect the row conductor to the column conductor, the improvement comprising the substrate consisting of means for preventing optical cross talk between adjacent cells, said means being a material which is at least light impermeable in the light-sensitive spectrum of the photoconductive cell so that light projected on one cell is not conducted by the substrate to create a false signal in adjacent cells.

2. In a photosensitive matrix according to claim 1, wherein the material of the substrate consists of ceramic material, and said ceramic material is dyed black.

3. In a photosensitive matrix according to claim 2, wherein the dyed black ceramic consists of $Al_2O_3$ mixed with $Fe_2O_3$.

* * * * *